(12) United States Patent
Kim et al.

(10) Patent No.: US 9,136,426 B2
(45) Date of Patent: Sep. 15, 2015

(54) METHOD FOR PROCESSING DEVICES INCLUDING QUANTUM DOTS AND DEVICES

(71) Applicant: QD VISION, INC., Lexington, MA (US)

(72) Inventors: Sang-Jin Kim, Belmont, MA (US);
Matthew Stevenson, Woburn, MA (US);
Gagan Mahan, Belmont, MA (US);
Peter T. Kazlas, Sudbury, MA (US)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 14/076,409

(22) Filed: Nov. 11, 2013

(65) Prior Publication Data
US 2014/0234999 A1   Aug. 21, 2014

Related U.S. Application Data

(63) Continuation of application No. PCT/US2012/037545, filed on May 11, 2012.

(60) Provisional application No. 61/485,027, filed on May 11, 2011.

(51) Int. Cl.
*H01L 21/00* (2006.01)
*H01L 33/00* (2010.01)
(Continued)

(52) U.S. Cl.
CPC .............. *H01L 33/005* (2013.01); *C09K 11/02* (2013.01); *C09K 11/565* (2013.01);
(Continued)

(58) Field of Classification Search
CPC ................................ H01L 33/00; H01L 33/66
USPC ............................................................ 438/26
See application file for complete search history.

(56) References Cited

U.S. PATENT DOCUMENTS

| 5,537,000 A | | 7/1996 | Alivisatos et al. |
| 6,121,075 A | * | 9/2000 | Yamashita .................... 438/149 |

(Continued)

FOREIGN PATENT DOCUMENTS

| KR | 100991904 B1 | 11/2010 |
| WO | WO2006088877 A1 | 8/2006 |

(Continued)

OTHER PUBLICATIONS

Arango, A.C., "A Quantum Dot Heterojunction Photodetector", submitted to the Department of Electrical Engineering and Computer Science, in partial fulfillment of the requirements for the degree of Masters of Science in Computer Science and Engineering at the Massachusetts Institute of Technology, Feb. 2005.

(Continued)

*Primary Examiner* — Caleb Henry

(57) ABSTRACT

A method of processing quantum dots is disclosed. The method comprises applying energy to excite the quantum dots to emit light and placing the quantum dots under vacuum after excitation of the quantum dots. Also disclosed is a method of processing a component including quantum dots comprising applying energy to the component including quantum dots to excite the quantum dots to emit light; and placing the component including quantum dots under vacuum after excitation. A method for processing a device is further disclosed, the method comprising applying energy to the device to excite the quantum dots to emit light; and placing the device under vacuum after excitation of the quantum dots. A method for preparing a device is also disclosed. Quantum dots, component, and devices of the methods are also disclosed.

20 Claims, 2 Drawing Sheets

(51) Int. Cl.

| | |
|---|---|
| *C09K 11/02* | (2006.01) |
| *C09K 11/56* | (2006.01) |
| *C09K 11/88* | (2006.01) |
| *H05B 33/10* | (2006.01) |
| *H05B 33/14* | (2006.01) |
| *H01L 33/06* | (2010.01) |
| *H01L 51/50* | (2006.01) |

(52) U.S. Cl.
CPC ............ *C09K 11/883* (2013.01); *H01L 33/06* (2013.01); *H05B 33/10* (2013.01); *H05B 33/14* (2013.01); *H01L 51/502* (2013.01)

(56) References Cited

U.S. PATENT DOCUMENTS

| | | | |
|---|---|---|---|
| 6,322,901 B1 | 11/2001 | Bawendi et al. | |
| 6,607,829 B1* | 8/2003 | Bawendi et al. | 428/403 |
| 7,465,595 B2* | 12/2008 | Song et al. | 438/46 |
| 7,569,984 B2 | 8/2009 | Yang et al. | |
| 7,772,551 B2 | 8/2010 | Todori et al. | |
| 7,776,630 B1* | 8/2010 | Kar et al. | 438/22 |
| 7,910,400 B2 | 3/2011 | Kwon et al. | |
| 8,012,604 B2 | 9/2011 | Kathirgamanathan et al. | |
| 8,232,722 B2 | 7/2012 | Bawendi et al. | |
| 8,334,527 B2 | 12/2012 | Iizumi et al. | |
| 8,921,827 B2* | 12/2014 | Pickett et al. | 257/13 |
| 2004/0000868 A1 | 1/2004 | Shimizu et al. | |
| 2004/0023010 A1 | 2/2004 | Bulovic et al. | |
| 2004/0091710 A1 | 5/2004 | Bawendi et al. | |
| 2004/0137263 A1 | 7/2004 | Burn et al. | |
| 2005/0006714 A1* | 1/2005 | Graetzel et al. | 257/431 |
| 2005/0017260 A1* | 1/2005 | Lee | 257/101 |
| 2005/0258418 A1 | 11/2005 | Steckel et al. | |
| 2006/0060998 A1* | 3/2006 | Strouse et al. | 264/5 |
| 2006/0061017 A1* | 3/2006 | Strouse et al. | 264/489 |
| 2006/0063029 A1 | 3/2006 | Jang et al. | |
| 2006/0068090 A1 | 3/2006 | Monbouquette et al. | |
| 2006/0099825 A1* | 5/2006 | Song et al. | 438/766 |
| 2006/0196375 A1 | 9/2006 | Coe-Sullivan et al. | |
| 2007/0057263 A1* | 3/2007 | Kahen | 257/79 |
| 2007/0103068 A1 | 5/2007 | Bawendi et al. | |
| 2007/0215856 A1 | 9/2007 | Kwon et al. | |
| 2007/0221947 A1* | 9/2007 | Locascio et al. | 257/103 |
| 2008/0001167 A1 | 1/2008 | Coe-Sullivan et al. | |
| 2008/0297029 A1 | 12/2008 | Cok | |
| 2009/0001349 A1 | 1/2009 | Kahen | |
| 2009/0087792 A1 | 4/2009 | Iizumi et al. | |
| 2009/0162011 A1 | 6/2009 | Coe-Sullivan et al. | |
| 2009/0253224 A1* | 10/2009 | Eisler et al. | 438/32 |
| 2009/0278141 A1* | 11/2009 | Coe-Sullivan et al. | 257/89 |
| 2010/0001256 A1 | 1/2010 | Coe-Sullivan et al. | |
| 2010/0051901 A1* | 3/2010 | Kazlas et al. | 257/13 |
| 2010/0068468 A1* | 3/2010 | Coe-Sullivan et al. | 428/172 |
| 2010/0283014 A1 | 11/2010 | Breen et al. | |
| 2010/0330715 A1* | 12/2010 | Gopal et al. | 438/29 |
| 2011/0025224 A1* | 2/2011 | Wood et al. | 315/291 |
| 2011/0080090 A1 | 4/2011 | Wood et al. | |
| 2011/0095261 A1 | 4/2011 | Kazlas et al. | |
| 2011/0101387 A1* | 5/2011 | Kinomoto | 257/89 |
| 2011/0103064 A1 | 5/2011 | Coe-Sullivan et al. | |
| 2011/0121260 A1* | 5/2011 | Jang et al. | 257/13 |
| 2011/0140075 A1 | 6/2011 | Zhou et al. | |
| 2011/0245533 A1 | 10/2011 | Breen et al. | |
| 2012/0187367 A1 | 7/2012 | Modi et al. | |
| 2012/0189791 A1 | 7/2012 | Modi et al. | |
| 2012/0248402 A1* | 10/2012 | Rapaport et al. | 257/10 |
| 2012/0248410 A1* | 10/2012 | Murayama | 257/13 |
| 2012/0292594 A1 | 11/2012 | Zhou et al. | |
| 2013/0003163 A1 | 1/2013 | Nowatzyk et al. | 359/296 |
| 2013/0009131 A1 | 1/2013 | Kazlas et al. | |
| 2013/0037778 A1 | 2/2013 | Kazlas et al. | |
| 2013/0069036 A1* | 3/2013 | Miyata | 257/13 |
| 2014/0054540 A1* | 2/2014 | Zhou et al. | 257/9 |
| 2014/0061584 A1 | 3/2014 | Mahan et al. | |
| 2014/0252316 A1* | 9/2014 | Yan et al. | 257/24 |

FOREIGN PATENT DOCUMENTS

| | | |
|---|---|---|
| WO | WO2007117698 A2 | 10/2007 |
| WO | WO2007143197 A2 | 12/2007 |
| WO | WO2009123763 A2 | 10/2009 |
| WO | WO2009151515 A1 | 12/2009 |
| WO | WO2010129350 A2 | 11/2010 |
| WO | WO2010129374 A2 | 11/2010 |
| WO | WO2011005859 A2 | 1/2011 |
| WO | WO2011044391 A1 | 4/2011 |
| WO | WO2011060180 A1 | 5/2011 |
| WO | WO2012158252 A1 | 11/2012 |
| WO | WO2013019299 A2 | 2/2013 |
| WO | WO2013019299 A3 | 2/2013 |

OTHER PUBLICATIONS

Asami, H. et al., "Photobrightening and Photodarkening in CdSe Nanocrystal/Polymer Thin Films", *Intl. Jrnl. Of Nanoscience*, vol. 1, Nos. 5&6 (2002), pp. 041-044.

Asami, H. et al., "Surface State Analysis of Photobrightening in CdSe Nanocrystal Thin Films", *J. Phys. Chem B* (2003), vol. 107, pp. 12566-12568.

Bulovic, V. et al., "Transparent light-emitting devices", *Nature* (1996), vol. 380, p. 29.

Carrillo-Carrion, C. et al., "Quantum dots luminescence enhancement due to illumination with UV/Vis light" *ChemComm*, 2009.

Carter, et al., "Enhanced luminance in polymer composite light emitting devices", *Appl. Phys. Lett.* (1997), vol. 71 (9).

Caruge et al., "Colloidal quantum-dot light-emitting diodes with metal-oxide charge transport layers", 2008 *Nature Photonics* vol. 2, pp. 247-250.

Choi, et al., "Synthesis of size-controlled CdSe quantum dots and characterization of CdSe-conjugated polymer blends for hybrid solar cells", *J. Photochem. & Photobio. A: Chem.* (2006), vol. 179, Issues 1-2, pp. 135-141.

Chon, J.W.M. et al., "Two-photon-induced photoenhancement of densely packed CdSe/ZnSe/ZnS Nanocrystal Solids and its Application to Multilayer Optical Data Storage", *Appl. Phys. Lett.*, vol. 85, No. 23, (2004), pp. 5514-5516.

Coe-Sullivan, "Hybrid Organic/Quantum Dot Thin Film Structures and Devices", MIT Thesis in partial fulfillment of Ph.D. in Electrrical Engineering and Computer Science (2005).

Coe-Sullivan, "The Application of Quantum Dots in Display Technology", *Material Matters*, vol. 2, No. 1, pp. 13-14 (Sigma-Aldrich 2007).

Cordero, et al., "Photo-Activated Luminescence of CdSe Quantum Dot Monolayers," *J. Phys. Chem B.* 104, pp. 12137-12142 (2000).

Dabbousi, et al., "(CdSe) ZnS Core-Shell Quantum Dots: Synthesis and Characterizaqtion of a Size Series of Highly Luminescent Nanocrystallites", *J. Phys. Chem.* 101, 9463, 1997.

Duncan, T. et al. "Improving the Quantum Yields of Semiconductor Quantum Dots Through Photoenhancement Assisted by Reducing Agents", *J. Phys. Chem.*, (2009), vol. 113, pp. 7561-7566.

Efros, et al., "Band-Edge Exciton in Quantum Dots of Semiconductors with a Degenerate Valence Band: Dark and Bright Exciton States," Phys. Rev. B 54, 4843-4856 (1996).

Gu, G. et al., "Transparent organic light emitting devices", *Appl. Phys. Lett.* (1996), vol. 68, pp. 2606-2608.

Henglein, et al., "Photochemistry and Radiation Chemistry of Semiconductor Colloids: Reaction of the Hydrated Electron with CdS and Non-Linear Optical Effects", Chem. Phys. Lett., vol. 132, No. 2, pp. 133-136 (1986).

Hess, B.C. et al., "Surface Transformation and Photoinduced Recovery in CdSe Nanocrystals", Phys. Rev. Lett., vol. 86, No. 14, pp. 3133-3135 (2001).

Jones, M. et al., "Photoenhancement of Luminescence in Colloidal CdSe Quantum Dot Solutions", *J. Phys. Chem. B*, (2003) vol. 107, pp. 11346-11352.

(56) References Cited

OTHER PUBLICATIONS

Kazlas, et al., "Printable High Efficiency Quantum Dot Light Emitting Diodes for Information Displays," *XXIX International Display Research Conferenc, Eurodisplay* 2009, Rome, Italy, Sep. 14-17, 2009. Conference held at the University of Rome.

Kazlas, et al., "Progress in Developing High Efficiency Quantum Dot Displays," SID Symposium Digest 38, 856-859 (2007).

Kim, D. et al., "Layer-by-Layer Assembly of Colloidal Cds and ZnS-CdS Quantum Dots and Improvement of Their Photoluminescence Properties", *J. Phys. Chem.*, (2009), vol. 113, pp. 7015-7018.

Kim, K., et al., "Photoenhancement of a Quantum Dot Nanocomposite via UV Annealing and its Application to White LEDs" *Adv. Mater.*, 23, 911-914, 2011.

Korsunska, N.E. et al., "Reversible and non-reversible photo-enhanced luminescence in CdSe/ZnS quantum dots", *Semicond. Sci. Technol.*, vol. 20 (2005), pp. 876-881.

Lee, S. et al., "Brightening, Blinking, Bluing and Bleaching in the Life of a Quantum Dot: Friend or Foe", *ChemPhysChem*, (2009), 10, 2174-2191.

Li, S., et al., "Surface States in the Photoionization of High-Quality CdSe Core/Shell Nanocrystals" ACS Nano (2009), vol. 3, No. 5, pp. 1267-1273. (Published on-line Apr. 17, 2009).

Liu, C. et al., "Temperature-dependent Brightening and Darkening of Photoluminescence from PbS Quantum Dots in Glasses", *Appl. Phys. Lett.* 90, 241111 (2007).

Mashford, et al., "All-inorganic quantum-dot light-emitting devices formed via low-cost, wet-chemical processing", *J. Mater, Chem.* 20, pp. 167-172 (2010).

Murase, et al., "Anomalous Photoluminescence in Silica-Coated Semiconductor Nanocrystals After Heat Treatment" *Small* vol. 5, No. 7, pp. 800-803, (2009).

Nazzal, A. et al., "Environmental Effects on Photoluminescence of Highly Luminescent CdSe and CdSe/ZnS Core/Shell Nanocrystals in Polymer Thin Films", *J. Phys. Chem. B.* 2004, vol. 108, pp. 5507-5515.

Oda, M., et al., "Photoluminescence of CdSe/ZnS/TOPO nanocrystals expanded on silica glass substrates: Adsorption and desorption effects of polar molecules on nanocrystal surfaces," J. Luminescence 119-120, pp. 570-575 (2006).

Oda, M., et al. "Photobrightening of CuBr Nanocrystals in PMMA", *J. Of Luminescence*, vol. 87-89 (2000), pp. 469-471.

Oda, M., et al., "Photobrightening of CdSe/ZnS/TOPO Nanocrystals", *ScienceDirect, J. Of Luminescence*, vol. 122-123 (2007), pp. 762-765.

Oda, M., et al., "Photoluminescence behaviors of single CdSe/ZnS/TOPO nanocrystals: Adsorption effects of water molecules onto nanocrystal surfaces", *J. Luminescence* (2007) vol. 127, pp. 198-203.

Oda, M., et al., "Reversible photobluing of CdSe/ZnS/TOPO nanocrystals", *Colloids and Surfaces B: Biointerfaces* (2007), vol. 56, pp. 241-245.

PCT Search Report and Written Opinion mailed Feb. 1, 2013 for PCT/US2012/037545, of which is the present application is a continuation.

Pechstedt, et al., "Photoluminescence of Colloidal CdSe/ZnS Quantum Dots: The Critical Effect of Water Molecules", *J. Phys. Chem. C* (2010), vol. 114, pp. 12069-12077.

Peterson, J. J. et al., "Photobrightening and photodarkening in PbS quantum dots", *Phys. Chem. Chem. Phys.*, (2006), pp. 3851-3856.

Polyakov, et al., "Some aspects of pulsed laser deposition of Si nanocrystalline films", *Euro. Phys. J. Appl. Phys.* (2009), vol. 48, No. 2, pp. 1-5.

Schlamp, M.C. et al., "Improved efficiencies in light emitting diodes made with CdSe(CdS) core/shell type nanocrystals and a semiconducting polymer", *J. Appl. Phys.*, vol. 82, No. 11, pp. 5837-5842, 1997.

Sharma, S.C. "A review of the electro-optical properties and their modification by radiation in polymer-dispersed liquid crystals and thin films containing CdSe/ZnS quantum dots", *Materials Science and Engineering B*, vol. 168 (2010), pp. 5-15.

Shen, et al., "Assembly of CdS Quantum Dots onto Mesoscopic TiO2 Films for Quantum Dot-Sensitized Solar Cell Applications", *Nanotechnology*, (2008) vol. 19, 045602 (7pp).

Shim, et al., "Doping and Charging in Colloidal Semiconductor Nanocrystals", MRS Bulletin/Dec. 2001, pp. 1005-1008.

Wada, et al., "Photoinduced Film Formation of Colloidal CdSe Quantum Dots", J. Phys. Chem. C, vol. 112, pp. 17109-17114 (2008).

Woo, W-K., et al., "Reversible Charging of CdSe Nanocrystals in a Simple Solid-State Device", *Advanced Materials* vol. 14, No. 15, pp. 1068-1071 (2002).

Yuan, C.T. et al., "Photoinduced Fluorescence enhancement in colloidal CdSeTe/Zns core/shell quantum dots", *Applied Physics Letters 92*, (2008), 183108, 1-3.

\* cited by examiner

METHOD FOR PROCESSING DEVICES INCLUDING QUANTUM DOTS AND DEVICES

This application is a continuation of International Application No. PCT/US2012/037545, filed 11 May 2012, which was published in the English language as International Publication No. WO 2013/019299 on 7 Feb. 2013, which International Application claims priority to U.S. Provisional Patent Application No. 61/485,027 filed 11 May 2011. Each of the foregoing is hereby incorporated herein by reference in its entirety.

FEDERALLY SPONSORED RESEARCH OR DEVELOPMENT

This invention was made with Government support under Contract No. 2004*H838109*000 awarded by the Central Intelligence Agency. The Government has certain rights in the invention.

TECHNICAL FIELD OF THE INVENTION

The present invention relates to the technical field of quantum dots.

SUMMARY OF THE INVENTION

The present invention relates to quantum dots, components including quantum dots, and devices including quantum dots, and methods related to the foregoing.

In accordance with one aspect of the present invention, there is provided a method of processing quantum dots. The method comprises applying energy to excite the quantum dots to emit light; and placing the quantum dots under vacuum after excitation of the quantum dots.

The quantum dots are excited to emit light.

Applying energy to the quantum dots can comprise application of voltage, application of current, applied field (positive or negative, AC or DC), or other application of energy (e.g., light, etc.) to excite the quantum dots to emit light.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable.

The excitation step can be carried out in air.

The excitation step can be carried out in an inert atmosphere.

The amount of time quantum dots are placed under vacuum can vary. For example, the quantum dots can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots are not subject to excitation during the vacuum step.

In certain embodiments, the excitation step can be carried out under vacuum followed by further evacuating the quantum dots after excitation.

The method can further comprise further processing of the quantum dots after the vacuum step in the absence of oxygen.

For example, the method can further include encapsulating the quantum dots after the vacuum step.

Preferably encapsulation is carried out in the absence of oxygen.

Quantum dots can include one or more different types of quantum dots (based on composition, structure and/or size). A type of quantum dot can be selected to emit light at a predetermined wavelength. A type of quantum dot can be selected such that the peak wavelength of light emitted by one type of quantum dot is distinct from that emitted by at least one of the other types of quantum dots that may be included. A type of quantum dot can be selected such that the peak wavelength of light emitted by one type of quantum dot is the same as that emitted by at least one of the other types of quantum dots that may be included.

In accordance with another aspect of the present invention, there is provided quantum dots processed by a method taught herein.

In accordance with another aspect of the present invention, there is provided a method of processing a component including quantum dots. The method comprises applying energy to the component including quantum dots to excite the quantum dots to emit light; and placing the component including quantum dots under vacuum after excitation.

Applying energy to the quantum dots included in the component can comprise application of voltage, application of current, applied field (positive or negative, AC or DC), or other application of energy (e.g., light, etc.) to the device to excite the quantum dots to emit light.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable.

The excitation step can be carried out in air.

The excitation step can be carried out in an inert atmosphere.

The amount of time the component including quantum dots is placed under vacuum can vary. For example, the component can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots included the component are not subject to excitation during the vacuum step.

In certain embodiments, the excitation step can be carried out under vacuum followed by further evacuating the quantum dots after excitation.

The method can further comprise further processing of the component including quantum dots after the vacuum step in the absence of oxygen.

For example, the method can further include encapsulating the component after the vacuum step.

Preferably encapsulation is carried out in the absence of oxygen.

A component can include one or more different types of quantum dots (based on composition, structure and/or size), as discussed above.

Quantum dots can be included in one or more layers that are included on and/or in a component.

A layer can further include one or more layers.

A component can optionally include one or more additional layers that do not include quantum dots.

In accordance with another aspect of the present invention, there is provided a component including quantum dots processed by a method taught herein.

In accordance with another aspect of the present invention, there is provided a method of processing a device comprising quantum dots disposed between a pair of electrodes. The method comprises applying energy to the device to excite the quantum dots to emit light; and placing the device under vacuum after excitation of the quantum dots.

Applying energy to the device can comprise application of voltage, application of current, applied field (positive or negative, AC or DC), or other application of energy (e.g., light, etc.) to the device to excite the quantum dots to emit light.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable.

The excitation step can be carried out in air.

The excitation step can be carried out in an inert atmosphere.

The amount of time the device is placed under vacuum can vary. For example, the device can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times prior to encapsulating the device.

Preferably, the quantum dots are not subject to excitation during the vacuum step.

In certain embodiments, the excitation step can be carried out under vacuum followed by further evacuating the quantum dots after excitation.

For example, the method can further include encapsulating the device after being placed in vacuum.

Preferably encapsulation is carried out in the absence of oxygen.

A device can include one or more different types of quantum dots (based on composition, structure and/or size), as discussed above.

Quantum dots can be included in one or more layers included in a device.

A layer can further include one or more layers.

A device can further include a first charge transport layer that can comprise an organic or inorganic material. A device can further include a second charge transport layer that can comprise an organic or inorganic material.

In accordance with another aspect of the present invention, there is provided a device processed by a method taught herein.

In accordance with another aspect of the present invention, there is provided a method for preparing a device, the method comprising: fabricating a device structure including quantum dots disposed between two electrodes; applying energy to the device to excite the quantum dots to emit light; and placing the device structure under vacuum after excitation of the quantum dots.

Applying energy to the device can comprise application of voltage, application of current, applied field (positive or negative, AC or DC), or other application of energy (e.g., light, etc.) to the device to excite the quantum dots to emit light.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable.

The excitation step can be carried out in air.

The excitation step can be carried out in an inert atmosphere.

The amount of time the device is placed under vacuum can vary. For example, the device can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times prior to encapsulating the device.

Preferably, the quantum dots are not subject to excitation during the vacuum step.

In certain embodiments, the excitation step can be carried out under vacuum followed by further evacuating the quantum dots after excitation.

For example, the method can further include encapsulating the device after being placed in vacuum.

Preferably encapsulation is carried out in the absence of oxygen.

A device can include one or more different types of quantum dots (based on composition, structure and/or size), as discussed above.

Quantum dots can be included in one or more layers included in a device.

A layer can further include one or more layers.

A device can further include a first charge transport layer that can comprise an organic or inorganic material. A device can further include a second charge transport layer that can comprise an organic or inorganic material.

In accordance with yet another aspect of the present invention, there is provided a device made by a method taught herein.

In all the methods and applications recited herein, quantum dots can be included in a composition including one or more additional materials when the quantum dots, components including quantum dots, and/or devices including quantum dots are made or processed in accordance with any of the methods recited herein. Examples of additional materials can include, without limitation and depending upon the particular application, a solid host material, a liquid (e.g., as in an ink, etc.), or a semisolid material. Such additional materials can also comprise a mixture including one or more solids, liquids, and/or semisolid materials. Such additional materials are described further below.

The methods taught herein may be advantageous for use with quantum dots, the preparation or use of which may involve one or more of the following, in any order: photoluminescent excitation, heat, pressure, applied field (positive or negative, AC or DC), operation in an inert atmosphere or air, electro/photochemistry induced in the stack via electroluminescent operation, bonding (chemical or physical) of the quantum dot layer to a charge transport material.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

Figure 1:
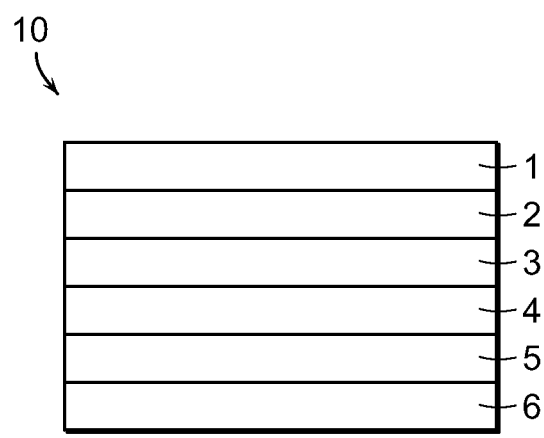
FIG. 1 is a schematic drawing depicting an example of an embodiment of a light-emitting device structure that can be made or processed in accordance with the invention.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

The present invention relates to quantum dots, components including quantum dots, and devices including quantum dots, and methods related to the foregoing.

In accordance with one aspect of the present invention, there is provided a method of processing quantum dots. The method comprises applying energy to excite the quantum dots to emit light; and placing the quantum dots under vacuum after excitation of the quantum dots.

Applying energy to the quantum dots can comprise application of voltage, application of current, applied field (positive or negative, AC or DC), or other application of energy (e.g., light, etc.) to the device to excite the quantum dots to emit light.

As the skilled artisan will appreciate, the energy employed herein to excite the quantum dots to emit light can vary. Similarly, the time of application of the excitation energy can also vary. In all the methods and applications recited herein, sufficient energy is applied to excite the quantum dots to emit light.

Factors that can influence the energy and/or time include, but are not limited to quantum dot size, quantum dot composition, the amount of quantum dots, the thickness of layers including quantum dots, other materials present during excitation, etc.

Examples of light that can be used to excite the quantum dots to emit light include light with a peak emission less than the emission wavelength of quantum dots being excited.

When the quantum dots are excited electrically, for example, current densities typically used to drive quantum dots in a device can be used. In certain embodiments, for example, the quantum dots can be excited by application of a current density in a range from about 0.1 mA/cm$^2$ to about 1 A/cm$^2$. Other current densities may also be suitable. Selection of current density can vary depending on the materials or structure in which the quantum dots are included when excited. For high current densities (e.g. 100 mA/cm$^2$ or above), temperature is preferably controlled to avoid thermal damage to the quantum dots and/or other materials by means of techniques that are readily identified by the skilled artisan, including, but not limited to, cooling plates.

In certain embodiments, the method is carried out at a temperature in a range from about 25° C. to about 80° C. Other temperatures outside this range may also be suitable.

Application of energy can be continued after the quantum dots are excited to emit light for any amount of time. Preferably, application of energy is discontinued prior to onset of emission decay. For example, quantum dots can be excited for at 1 second, at least 30 seconds, at least one minute, at least one hour, etc. up to the amount of time at which quantum dot emission begins to decay. Other times may also be determined by the skilled artisan to be useful and/or desirable.

The excitation step can be carried out in air.

The excitation step can be carried out in an inert atmosphere.

The amount of time quantum dots are placed under vacuum can vary. For example, the quantum dots can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots are not subject to excitation during the vacuum step.

In certain embodiments, the excitation step can be carried out under vacuum followed by further vacuum treatment of the quantum dots after excitation.

The method can further comprise further processing of the quantum dots after the vacuum step in the absence of oxygen.

For example, the method can further include encapsulating the quantum dots after the vacuum step.

Preferably encapsulation is carried out in the absence of oxygen.

Quantum dots can include one or more different types of quantum dots (based on composition, structure and/or size). A type of quantum dot can be selected to emit light at a predetermined wavelength. A type of quantum dot can be selected such that the peak wavelength of light emitted by one type of quantum dot is distinct from that emitted by at least one of the other types of quantum dots that may be included. A type of quantum dot can be selected such that the peak wavelength of light emitted by one type of quantum dot is the same as that emitted by at least one of the other types of quantum dots that may be included.

As discussed above, in all the methods and applications recited herein, quantum dots can optionally be included in a composition including one or more additional materials when the quantum dots, components including quantum dots, and/or devices including quantum dots are made or processed in accordance with any of the methods recited herein. Examples of additional materials can include, without limitation and depending upon the particular application, a solid host material, a liquid (e.g., as in an ink, etc.), or a semisolid material. Such additional materials can also comprise a mixture including one or more solids, liquids, and/or semisolid materials.

Examples of additional materials that can be included in a composition including quantum dots include, without limitation, those described in U.S. patent application Ser. No. 12/940,355 of Coe-Sullivan et al. filed Nov. 5, 2010, for "Solid State Lighting Devices Including Quantum Confined Semiconductor Nanoparticles, An Optical Component For A Solid State Light Device, And Methods" (which is hereby incorporated herein by reference in its entirety). Other materials in addition to those described in U.S. patent application Ser. No. 12/940,355 may be determined by the skilled artisan to be useful and/or desirable.

The amount of quantum dots included in a composition that includes other materials can be readily determined by the skilled artisan based on the particular materials and the intended end-use application.

In a preferred embodiment, once energy is applied to the quantum dots, the quantum dots are then placed under vacuum of at least 10 torr for a period of at least 3 hours.

Prior to the excitation step, quantum dots may be treated with small molecules (e.g., water vapor) and/or light flux, as described in International Patent Application No. PCT/US2010/56397 of QD Vision, Inc. filed 11 Nov. 2010, entitled "Device Including Quantum Dots", which is hereby incorporated herein by reference in its entirety. Each of U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010, from which International Patent Application No. PCT/US2010/56397 claims priority, is also incorporated herein by reference in its entirety.

Examples of small molecules described in International Patent Application No. PCT/US2010/56397 include a small molecule including no more than 50 atoms, a small molecule including no more than 30 atoms, a small molecule including no more than 20 atoms, a small molecule including no more than 10 atoms, a small molecule including no more than 5 atoms, a small molecule having a molecular weight of less than or equal to 100 a.m.u. A small molecule can comprise a small polar molecule. Examples of small polar molecules include water, a $C_1$-$C_3$ alcohol (e.g., methanol, ethanol, etc.), hydrogen sulfide, phenol, hydrazine, arsine, phosphine, ammonia, ammonium hydroxide, hydrogen fluoride, hydrogen chloride, hydrogen bromide, hydrogen iodide, a $C_1$-$C_3$ thiol, etc. In certain embodiments, a small polar molecule can comprise a mixture comprising an inorganic salt (e.g., without limitation, sodium chloride) and water. A small molecule can comprise a mixture of two or more different small molecules. Small molecules can be in a gaseous state, in a liquid state. Small molecules can be included in a carrier gas. Small molecules can be included in a carrier liquid. Mixtures including small molecules can also be used. A small molecule can be in the form of a gas and/or liquid that can be further dispersed in a carrier gas or liquid. A small molecule can be included in a mist, vapor, spray, gas flow stream, etc. A small molecule can include a lone electron pair. Other small molecules can be suitable.

As also described in International Patent Application No. PCT/US2010/56397, exposure to small molecules can be carried out in air, in the substantial absence of oxygen, in the absence of oxygen, in nitrogen, in argon, in another inert atmosphere, etc.

As described in International Patent Application No. PCT/US2010/56397, exposure to small molecules can be carried out at a temperature in a range from about 20° to about 80° C., at a temperature of about 25° C., at room temperature, etc. Other temperatures may also be suitable.

Exposure to small molecules can be carried out at a pressure greater than 1 atmosphere. Exposure to small molecules can be carried out at a pressure of about 1 atmosphere. Exposure to small molecules can be carried out at a pressure of less than 1 atmosphere. Other pressures may be desirable or useful.

As described in International Patent Application No. PCT/US2010/56397, in certain embodiments, the quantum dots can be exposed to small molecules for at least about 30 seconds, for at least about 1 minute, for at least about 5 minutes, for at least about 15 minutes, etc. Other times may be determined to be useful or desirable. In certain embodiments, all or a portion of the exposed surfaces of the quantum dots is exposed to small molecules for a predetermined period of time.

International Patent Application No. PCT/US2010/56397 also describes examples of techniques for exposing quantum dots to small molecules. In certain embodiments, exposing quantum dots to small molecules comprises exposing all or a portion of the exposed surfaces of the quantum dots to an environment including small molecules that are in a gaseous state and/or liquid state. Various techniques described in such International Application for exposing small molecules to all or a portion of exposed surfaces of the layer comprising quantum dots can be useful or desirable.

As mentioned above, in certain embodiments, the quantum dots can be exposed to small molecules and light flux prior to the excitation step. As described in such International Application, the light flux can include a peak emission wavelength in a range from about 365 nm to about 480 nm, for example, in a range from about 400 nm to about 480 nm, in a range from about 450 nm to about 470 nm, etc. Other wavelengths may also be suitable. Examples of light flux intensity described therein include light flux from about 10 to about 100 mW/cm². In certain embodiments, the light flux is about 30 mW/cm².

Other small molecules and light fluxes in addition to those describe in International Patent Application No. PCT/US2010/56397 may also be suitable.

In certain embodiments, quantum dots may be treated with small molecules (e.g., water vapor and other small molecules described in International Patent Application No. PCT/US2010/56397 of QD Vision, Inc. filed 11 Nov. 2010) during the excitation step.

In accordance with another aspect of the present invention, there is provided quantum dots processed by a method taught herein.

In accordance with another aspect of the present invention, there is provided a method of processing a component including quantum dots. The method comprises applying energy to the component including quantum dots to excite the quantum dots to emit light; and placing the component including quantum dots under vacuum after excitation.

Applying energy to the quantum dots included in the component can comprise application of voltage, application of current, applied field (positive or negative, AC or DC), or other application of energy (e.g., light, etc.) to the device to excite the quantum dots to emit light.

Examples of light that can be used to excite the quantum dots to emit light include light with a peak emission less than the emission wavelength of quantum dots being excited.

When the quantum dots are excited electrically, for example, current densities typically used to drive quantum dots in a device can be used. In certain embodiments, for example, the quantum dots can be excited by application of a current density in a range from about 0.1 mA/cm$^2$ to about 1 A/cm$^2$. Other current densities may also be suitable. Selection of current density can vary depending on the environment in which the quantum dots are included when excited. For high current densities (e.g. 100 mA/cm$^2$ or above), temperature is preferably controlled to avoid thermal damage to the quantum dots and/or component by means of techniques that are readily identified by the skilled artisan, including, but not limited to, cooling plates.

In certain embodiments, the method is carried out at a temperature in a range from about 25° C. to about 80° C. Other temperatures outside this range may be suitable.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable. The excitation step can be carried out in air.

The excitation step can be carried out in an inert atmosphere.

The amount of time the component including quantum dots is placed under vacuum can vary. For example, the quantum dots can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots in the component are not subject to excitation during the vacuum step.

In certain embodiments, the excitation step can be carried out under vacuum followed by further vacuum treatment of the quantum dots after excitation.

The method can further comprise further processing of the component including quantum dots after the vacuum step, preferably in the absence of oxygen.

For example, the method can further include encapsulating the component after the vacuum step.

Preferably encapsulation is carried out in the absence of oxygen.

A component can include one or more different types of quantum dots (based on composition, structure and/or size), as discussed above.

As discussed above, quantum dots included in a component taught herein may optionally be further included in a composition including one more additional materials.

Quantum dots can be included in one or more layers that are included on and/or in a component.

A layer can further include one or more layers.

A layer can comprise a composition comprising quantum dots dispersed in a host material, as discussed above. Optionally, such composition can further include other materials and/or additives as discussed above.

A layer can comprise neat quantum dots (e.g., not dispersed in a host material).

A component can optionally include one or more additional layers that do not include quantum dots.

In a preferred embodiment, once energy is applied to the quantum dots in the component, the component is then placed under vacuum of at least 10 torr for a period of at least 3 hours.

Prior to the excitation step, quantum dots included in and/or on a component may be treated with small molecules (e.g., water vapor) and/or light flux, as described in International Patent Application No. PCT/US2010/56397 of QD Vision, Inc. filed 11 Nov. 2010, entitled "Device Including Quantum Dots", which is hereby incorporated herein by reference in its entirety. Each of U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010, from which International Patent Application No. PCT/US2010/56397 claims priority, is also incorporated herein by reference in its entirety. (See above discussion of examples thereof from such International Application.)

Other small molecules and light fluxes in addition to those describe in International Patent Application No. PCT/US2010/56397 may also be determined to be useful or desirable.

In certain embodiments, quantum dots included in and/or on a component may be treated with small molecules (e.g., water vapor and other small molecules described in International Patent Application No. PCT/US2010/56397 of QD Vision, Inc. filed 11 Nov. 2010), during the excitation step.

In accordance with another aspect of the present invention, there is provided a component including quantum dots processed by a method taught herein.

In accordance with another aspect of the present invention, there is provided a method of processing a device comprising quantum dots disposed between a pair of electrodes. The method comprises applying energy to the device to excite the quantum dots to emit light; and placing the device under vacuum after excitation of the quantum dots.

Applying energy to the device can comprise application of voltage, application of current, applied field (positive or negative, AC or DC), or other application of energy (e.g., light, etc.) to the device to excite the quantum dots to emit light.

Examples of light that can be used to excite the quantum dots to emit light include light with a peak emission less than the emission wavelength of quantum dots being excited.

When the quantum dots are excited electrically, for example, current densities typically used to drive quantum dots in a device can be used. In certain embodiments, for example, the quantum dots can be excited by application of a current density in a range from about 0.1 mA/cm$^2$ to about 1 A/cm$^2$. Other current densities may also be suitable. Selection of current density can vary depending on the device materials and device structure in which the quantum dots are included when excited. For high current densities (e.g. 100 mA/cm$^2$ or above), temperature is preferably controlled to avoid thermal damage to the quantum dots, device structure and/or device materials by means of techniques that are readily identified by the skilled artisan, including, but not limited to, cooling plates.

In certain embodiments, the method is carried out at a temperature in a range from about 25° C. to about 80° C. Other temperatures outside this range may be suitable.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable. The excitation step can be carried out in air.

The excitation step can be carried out in an inert atmosphere.

The amount of time the device is placed under vacuum can vary. For example, the device can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots in the device are not subject to excitation during the vacuum step.

In certain embodiments, the excitation step can be carried out under vacuum followed by further vacuum treatment of the quantum dots after excitation.

The method can further comprise further processing of the device including quantum dots after the vacuum step, preferably in the absence of oxygen.

For example, the method can further include encapsulating the device after being placed in vacuum.

Preferably encapsulation is carried out in the absence of oxygen.

A device can include one or more different types of quantum dots (based on composition, structure and/or size), as discussed above.

As discussed above, quantum dots included in a device taught herein may optionally be further included in a composition including one more additional materials.

Quantum dots can be included in one or more layers included in a device.

A layer can further include one or more layers.

A layer can comprise a composition comprising quantum dots dispersed in a host material, as discussed above. A host material can optionally comprise a material capable of transporting charge (e.g., a holes or electrons). Optionally, such composition can further include other materials and/or additives as discussed above.

A layer can comprise neat quantum dots (e.g., not dispersed in a host material).

A device can further include a first charge transport layer that can comprise an organic or inorganic material. A device can further include a second charge transport layer that can comprise an organic or inorganic material.

In a preferred embodiment, once energy is applied to the device to excite the quantum dots to emit light, the device is then placed under vacuum of at least 10 torr for a period of at least 3 hours.

In certain embodiments, a device treated by a method described herein can include quantum dots that were treated with small molecules (e.g., water vapor) and/or light flux during fabrication of the device, as described in International Patent Application No. PCT/US2010/56397 of QD Vision, Inc. filed 11 Nov. 2010, entitled "Device Including Quantum Dots", which is hereby incorporated herein by reference in its entirety. Each of U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010, from which International Patent Application No. PCT/US2010/56397 claims priority, is also incorporated herein by reference in its entirety. (See above discussion of examples thereof from such International Application.) Other small molecules and light fluxes in addition to those describe in International Patent Application No. PCT/US2010/56397 may also be used.

In certain embodiments, exposed surfaces of quantum dots included in a device treated by a method described herein may be treated with small molecules (e.g., water vapor and other small molecules described in International Patent Application No. PCT/US2010/56397 of QD Vision, Inc. filed 11 Nov. 2010), prior to and/or during the excitation step.

In accordance with another aspect of the present invention, there is provided a device processed by a method taught herein.

In accordance with another aspect of the present invention, there is provided a method for preparing a device, the method comprising: fabricating a device structure including quantum dots disposed between two electrodes; activating the quantum dots in the device; and placing the device structure under vacuum after activation of the quantum dots.

Applying energy to the device can comprise application of voltage, application of current, applied field (positive or negative, AC or DC), or other application of energy (e.g., light, etc.) to the device to excite the quantum dots to emit light.

Examples of light that can be used to excite the quantum dots to emit light include light with a peak emission less than the emission wavelength of quantum dots being excited.

When the quantum dots are excited electrically, for example, current densities typically used to drive quantum dots in a device can be used. In certain embodiments, for example, the quantum dots can be excited by application of a current density in a range from about 0.1 mA/cm$^2$ to about 1 A/cm$^2$. Other current densities may also be suitable. Selection of current density can vary depending on the environment in which the quantum dots are included when excited. For high current densities (e.g. 100 mA/cm$^2$ or above), temperature is preferably controlled to avoid thermal damage to the quantum dots and/or the device by means of techniques that are readily identified by the skilled artisan, including, but not limited to, cooling plates.

In certain embodiments, the method is carried out at a temperature in a range from about 25° C. to about 80° C. Other temperatures outside this range may be suitable.

Application of energy can be continued after the quantum dots are excited to emit light for any amount of time. Preferably, application of energy is discontinued prior to onset of emission decay. For example, quantum dots can be excited for at least 1 second, at least 30 seconds, at least one minute, at least one hour, etc. up to the amount of time at which quantum dot emission begins to decay. Other times may also be determined by the skilled artisan to be useful and/or desirable. The excitation step can be carried out in air.

The excitation step can be carried out in an inert atmosphere.

The amount of time the device is placed under vacuum can vary. For example, the device can be placed under vacuum for at least 1 minute, at least 10 minutes, at least 30 minutes, at least 1 hour, etc. Placing the quantum dots under vacuum for about 3 or more hours can be preferred. Other times may also be determined by the skilled artisan to be useful and/or desirable.

A vacuum of at least 10 torr can be preferred. Higher vacuum levels (e.g., 10-7 torr) can be useful. Other vacuum levels may also be determined by the skilled artisan to be useful and/or desirable.

Optionally, the method can further include repeating a sequence of steps including the excitation step and the vacuum step one or more times.

Preferably, the quantum dots in the device are not subject to excitation during the vacuum step.

In certain embodiments, the excitation step can be carried out under vacuum followed by further vacuum treatment of the quantum dots after excitation.

The method can further comprise further processing of the device including quantum dots after the vacuum step, preferably in the absence of oxygen.

For example, the method can further include encapsulating the device after being placed in vacuum.

Preferably encapsulation is carried out in the absence of oxygen.

A device can include one or more different types of quantum dots (based on composition, structure and/or size), as discussed above.

As discussed above, quantum dots included in a device taught herein may optionally be further included in a composition including one more additional materials.

Quantum dots can be included in one or more layers included in a device.

A layer can further include one or more layers.

A layer can comprise a composition comprising quantum dots dispersed in a host material, as discussed above. A host material can optionally comprise a material capable of transporting charge (e.g., a holes or electrons). Optionally, such composition can further include other materials and/or additives as discussed above.

A layer can comprise neat quantum dots (e.g., not dispersed in a host material).

A device can further include a first charge transport layer that can comprise an organic or inorganic material. A device can further include a second charge transport layer that can comprise an organic or inorganic material.

In a preferred embodiment, once energy is applied to the device to excite the quantum dots to emit light, the device is then placed under vacuum of at least 10 torr for a period of at least 3 hours.

During fabrication of the device structure (preferably prior to the excitation step), after quantum dots are disposed over the underlying device layer, the quantum dots may be treated with small molecules (e.g., water vapor) and/or light flux, as described in International Patent Application No. PCT/US2010/56397 of QD Vision, Inc. filed 11 Nov. 2010, entitled "Device Including Quantum Dots", which is hereby incorporated herein by reference in its entirety. Each of U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010, from which International Patent Application No. PCT/US2010/56397 claims priority, is also incorporated herein by reference in its entirety. (See above discussion of examples thereof from such International Application.)

Other small molecules and light fluxes in addition to those describe in International Patent Application No. PCT/US2010/56397 may also be determined to be useful or desirable.

In certain embodiments, during an excitation step carried out during fabrication of the device structure, the quantum dots may be treated with small molecules (e.g., water vapor and other small molecules described in International Patent Application No. PCT/US2010/56397 of QD Vision, Inc. filed 11 Nov. 2010) during the excitation step.

In accordance with yet another aspect of the present invention, there is provided a device made by a method taught herein.

The methods taught herein may be advantageous for use with quantum dots, the preparation or use of which may involve one or more of the following, in any order: photoluminescent excitation, heat, pressure, applied field (positive or negative, AC or DC), operation in an inert atmosphere or air, electro/photochemistry induced in the stack via electroluminescent operation, bonding (chemical or physical) of the quantum dot layer to a charge transport material.

In all the methods and applications recited herein, the quantum dots, component, or device, as the case may be, can be encapsulated following performance of the vacuum step. Such encapsulation can comprise sealing the device using a UV curable epoxy or such other encapsulation or packaging technique selected by the skilled artisan based on the item being encapsulated and the intended use thereof. Such encapsulation step is preferably carried out in an oxygen-free environment (e.g., nitrogen, other inert atmosphere, etc.), and the encapsulation or other packaging technique is selected to protect the quantum dots from at least oxygen after encapsulation or packaging. Optionally a desiccant or other moisture absorptive material can be included in the device before it is sealed, e.g., with an epoxy, such as a UV curable epoxy. Other desiccants or moisture absorptive materials can be used.

While not wishing to be bound by theory, the methods taught herein are believed to address a loss efficiency due to one or more of photoluminescent excitation, heat, pressure, applied field (positive or negative, AC or DC), operation in an inert atmosphere or air, electro/photochemistry induced in the stack via electroluminescent operation, and bonding (chemical or physical) of the quantum dot layer to a charge transport material.

The methods taught herein for processing or making a device may further enable, inter alia, one or more of air stable devices, air-processed devices (no glovebox), a broad choice of flexible substrates (owing to lowered sensitivity to air/moisture), and cost savings through relaxed requirements for encapsulation due to air stability enhancement.

The methods described herein can also be applied to previously prepared quantum dots, components, and/or devices including same. In such case, if such quantum dots are encapsulated or packaged so as to protect them, for example, from oxygen and/or moisture, such encapsulation or packaging is opened prior to performance of the method described herein. Following the excitation and vacuum steps, the so processed quantum dots, components and/or devices including same can be encapsulated or packaged to isolate the quantum dots from air, other sources of oxygen and/or moisture.

The methods taught herein are further expected to provide improved efficiency and/or lifetime for the quantum dots, component, and device processed or made thereby.

FIG. 1 provides a schematic representation of an example of a preferred light-emitting device that can be processed or made in accordance with the present invention. Referring to FIG. 1, the light-emitting device 10 includes (from top to bottom) a second electrode (e.g., an anode) 1, a second layer comprising a material capable of transporting charge (e.g., a material capable of transporting holes, which is also referred to herein as a "hole transport material") 2, an emissive layer including quantum dots 3, a first layer comprising a material capable of transporting charge (e.g., a material capable of transporting electrons, a material capable of transporting and injecting electrons, such materials also being referred to herein as an "electron transport material") 4, a first electrode (e.g., a cathode) 5, and a substrate 6.

In certain preferred embodiments, the electron transport material comprises an inorganic material.

In certain embodiments, the anode is proximate to and injects holes into the hole transport material while the cathode is proximate to and injects electrons into the electron transport material. The injected holes and injected electrons combine to form an exciton on the quantum dot and emit light. In certain embodiments, a hole injection layer is further included between the anode and the hole transport layer.

In certain embodiments, the device structure can be inverted.

In certain preferred embodiments, an electron transport material is also capable of injecting electrons.

The substrate 6 can be opaque or transparent. A transparent substrate can be used, for example, in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can be rigid or flexible. The substrate can be plastic, metal, semiconductor wafer, or glass. The substrate can be a substrate commonly used in the art. Preferably the substrate has a smooth surface. A substrate surface free of defects is particularly desirable.

The cathode 5 can be formed on the substrate 6. A cathode can comprise, for example, ITO, aluminum, silver, gold, etc. The cathode preferably comprises a material with a work function chosen with regard to the quantum dots included in the device. For example, a cathode comprising indium tin oxide (ITO) can be preferred for use with an emissive material including quantum dots comprising a CdSe core/CdZnS shell.

Substrates including patterned ITO are commercially available and can be used in making a device according to the present invention.

The layer comprising a material capable of transporting electrons 4 preferably comprises an inorganic material.

Examples of inorganic semiconductor materials include a metal chalcogenide, a metal pnictide, or elemental semiconductor, such as a metal oxide, a metal sulfide, a metal selenide, a metal telluride, a metal nitride, a metal phosphide, a metal arsenide, or metal arsenide. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof.

Preferably the material capable of transporting electrons also is capable of injecting electrons. In certain embodiments, the inorganic material included in the layer capable or transporting and injection electrons comprises an inorganic semiconductor material. A preferred material capable of transporting and injecting electrons comprises zinc oxide.

In certain embodiments, the inorganic semiconductor material can include a dopant.

In certain preferred embodiments, an electron transport material can include an n-type dopant.

An example of a preferred inorganic semiconductor material for inclusion in an electron transport material of a device in accordance with the invention is zinc oxide. In certain embodiments, zinc oxide can be mixed or blended with one or more other inorganic materials, e.g., inorganic semiconductor materials, such as titanium oxide.

As mentioned above, in certain preferred embodiments, a layer comprising a material capable of transporting and injecting electrons can comprise zinc oxide. Such zinc oxide can be prepared, for example, by a sol-gel process. In certain embodiments, the zinc oxide can be chemically modified. Examples of chemical modification include treatment with hydrogen peroxide.

In other embodiments, a layer comprising a material capable of transporting and injecting electrons can comprise a mixture including zinc oxide and titanium oxide.

The electron transport material is preferably included in the device as a layer. In certain embodiments, the layer has a thickness in a range from about 10 nm to 500 nm.

Electron transport materials comprising an inorganic semiconductor material can be deposited at a low temperature, for example, by a known method, such as a vacuum vapor deposition method, an ion-plating method, sputtering, inkjet printing, sol-gel, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate. Preferably an inorganic semiconductor material is nanocrystalline.

Additional information concerning inorganic materials that may be useful for inclusion in an electron transport layer is disclosed in International Application No. PCT/US2006/005184, filed 15 Feb. 2006, for "Light Emitting Device Including Semiconductor Nanocrystals, which published as WO 2006/088877 on 26 Aug. 2006, and International Application No. PCT/US2009/002123, filed 3 Apr. 2009, by QD Vision, Inc., et al, entitled "Light-Emitting Device Including Quantum Dots", which published as WO2009/123763 on 8 Oct. 2009, the disclosures of each of which are hereby incorporated herein by reference in their entireties.

In certain embodiments, a material capable of transporting electrons can comprise an organic material. Information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Device Including Semiconductor Nanocrystals", filed 21 Oct. 2005.

The emissive layer 3 includes quantum dots.

Preferred quantum dots for inclusion in an emissive material of a light-emitting device include core-shell structured nanocrystals. Examples include, for example, CdSe/ZnS, CdS/ZnSe, InP/ZnS, etc., wherein the core is composed of a semiconductor nanocrystal comprising a first inorganic semiconductor material (e.g. CdSe, CdS, etc.) and the shell is composed of a second crystalline inorganic semiconductor material (e.g., ZnS, ZnSe, etc.).

An emissive material can comprise one or more different quantum dots. The differences can be based, for example, on different composition, different size, different structure, or other distinguishing characteristic or property.

The color of the light output of a light-emitting device can be controlled by the selection of the composition, structure, and size of the quantum dots included in a light-emitting device as the emissive material.

The emissive material is preferably included in the device as a layer. In certain embodiments, the emissive layer can comprise one or more layers of the same or different emissive material(s). In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm. A thickness of 4 nm can be preferred in a device including an electron transport material including a metal oxide. Other thicknesses outside the above examples may also be determined to be useful or desirable.

An emissive material is typically deposited by a liquid-based technique including an ink comprising quantum dots dispersed in a liquid. Examples of liquid-based techniques for depositing an emissive material include, e.g., but not limited to, spin-casting, screen-printing, inkjet printing, gravure printing, roll coating, drop-casting, Langmuir-Blodgett techniques, contact printing or other liquid-based techniques known or readily identified by one skilled in the relevant art. (For additional related information, see, for example, U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, International Application No. PCT/US2007/008873, filed Apr. 9, 2007, of Coe-Sullivan et al., for "Composition Including Material, Methods Of Depositing Material, Articles Including Same And Systems For Depositing Material", which are hereby incorporated herein by reference.)

A hole transport material is preferably included in the device as a layer.

A hole transport layer can have a thickness in a range from about 10 nm to about 500 nm.

Examples of hole transport materials include organic material and inorganic materials. An example of an organic material that can be included in a hole transport layer includes an organic chromophore, The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), 4-4'-N,N'-dicarbazolyl-biphenyl (CBP), 4,4-, bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly (spiro-fluorene) derivatives, N,N'-di(naphthalene-1-yl)-N,N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and spiro-NPB.

In certain preferred embodiments, a hole transport layer comprises an organic small molecule material, a polymer, a spiro-compound (e.g., spiro-NPB), etc.

Organic hole transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., ≤$10^{-8}$ torr), high vacuum (e.g., from about $10^{-8}$ torr to about $10^{-5}$ torr), or low vacuum conditions (e.g., from about $10^{-5}$ torr to about $10^{-3}$ torr).

Hole transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety.

In certain embodiments of the inventions described herein, a hole transport layer can comprise an inorganic material. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

Hole transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc.

Device 10 can further include a hole-injection material. The hole-injection material may comprise a separate hole injection material or may comprise an upper portion of the hole transport layer that has been doped, preferably p-type doped. The hole-injection material can be inorganic or organic. Examples of organic hole injection materials include, but are not limited to, LG-101 (see, for example, paragraph (0024) of EP 1 843 411 A1) and other HIL materials available from LG Chem, LTD. Other organic hole injection materials can be used. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4,4',4"-tris(diphenylamino)triphenylamine (TDATA) that is doped with tetrafluoro-tetracyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1'biphenyl-4,4"diamine (alpha-NPD) doped with $F_4$-TCNQ. See J. Blochwitz, et al., "Interface Electronic Structure Of Organic Semiconductors With Controlled Doping Levels", Organic Electronics 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", J. Vac. Sci. Technol. A 22(4), July/August 2004. The disclosures of the foregoing papers are hereby incorporated herein by reference in their entireties.

As shown in FIG. 1, anode 1 may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

In certain embodiments, the electrode (e.g., anode or cathode) materials and other materials are selected based on the light transparency characteristics thereof so that a device can be prepared that emits light from the top surface thereof. A top emitting device can be advantageous for constructing an active matrix device (e.g., a display). In certain embodiments, the electrode (e.g., anode or cathode) materials and other materials are selected based on light transparency characteristics thereof so that a device can be prepared that emits light from the bottom surface thereof.

As mentioned above, the device can further include a substrate 6. Examples of substrate materials include, without limitation, glass, plastic, insulated metal foil.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be used. Optionally, a device may further include a layer with heat dissipating properties disposed over the top electrode. See, for example, U.S. Application No. 61/348,067 of Mahan et al, filed 25 May 2010 entitled "Devices & Methods", which is hereby incorporated herein by reference in its entirety.

A layer comprising an inorganic semiconductor material that includes a stratified structure (as described in International Application No. PCT/US2010/051867 of QD Vision, Inc. filed 7 Oct. 2010 entitled: ""Device Including Quantum Dots, which is hereby incorporated herein by reference in its entirety) can serve as a layer capable of transporting electrons, injecting electrons, and/or blocking holes.

A device in accordance with the present invention can further optionally include one or more interfacial layers as also described in above-referenced International Application No. PCT/US2010/051,867.

A quantum dot is a nanometer sized particle that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible and non-visible spectrum by changing their size. See C. B. Murray, C. R. Kagan, and M. G. Bawendi, *Annual Review of Material Sci.*, 2000, 30: 545-610 hereby incorporated by reference in its entirety.

A quantum dot can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

For convenience, the size of quantum dots can be described in terms of a "diameter". In the case of spherically shaped quantum dots, diameter is used as is commonly understood. For non-spherical quantum dots, the term diameter can typically refer to a radius of revolution (e.g., a smallest radius of revolution) in which the entire non-spherical quantum dot would fit.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group III-VI compounds, Group IV-VI compounds, Group compounds, Group II-IV-VI compounds, Group II-IV-V compounds, Group IV elements, an alloy including any of the foregoing, and/or a mixture including any of the foregoing.

A quantum dot can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the shell can be chosen so as to have an atomic spacing close to that of the "core" substrate. In certain other embodiments, the shell and core materials can have the same crystal structure.

Quantum dots can also have various shapes, including, but not limited to, sphere, rod, disk, other shapes, and mixtures of various shaped particles.

The quantum dots are typically colloidally grown and include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided.

By controlling the structure, shape and size of quantum dots during preparation, energy levels over a very broad range of wavelengths can be obtained while the properties of the bulky materials are varied. Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

A coordinating solvent can help control the growth of quantum dots. The coordinating solvent is a compound having a donor lone pair that, for example, has a lone electron pair available to coordinate to a surface of the growing quantum dots. Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for quantum dot production. Additional examples of suitable coordinating solvents include pyridine, tri-n-octyl phosphine (TOP), tri-n-octyl phosphine oxide (TOPO) and trishydroxy-lpropylphosphine (tHPP), tributylphosphine, tri(dodecyl) phosphine, dibutyl-phosphite, tributyl phosphite, trioctade-cyl phosphite, trilauryl phosphite, tris(tridecyl)phosphite, triisodecyl phosphite, bis(2-ethylhexyl)phosphate, tris(tridecyl)phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, di octadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of quantum dots can be further refined by size selective precipitation with a poor solvent for the quantum dots, such as methanol/butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot population preferably has no more than a 15% rms deviation from mean diameter, more preferably 10% rms deviation or less, and most preferably 5% rms deviation or less.

In certain embodiment, the ligands can be derived from the coordinating solvent used during the growth process.

In certain embodiments, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

A suitable coordinating ligand can be purchased commercially or prepared by ordinary synthetic organic techniques, for example, as described in J. March, Advanced Organic Chemistry.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

Other examples of ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3,5-di-tert-butyl-4-hydroxybenzylphosphonic acid, a conjugate base of the acid, or a mixture of the foregoing.

Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", each of the foregoing being hereby incorporated herein by reference.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum dots that can be included in a material, component, or device processed or made in accordance with a method taught herein can include one or more different types of quantum dots, wherein each type can be selected to emit light having a predetermined wavelength. In certain embodiments, quantum dot types can be different based on, for example, factors such composition, structure and/or size of the quantum dot.

Quantum dots can be selected to emit at any predetermined wavelength across the electromagnetic spectrum.

Different types of quantum dots that have emissions at the same and/or different wavelengths can be utilized.

In certain embodiments, quantum dots can be capable of emitting visible light.

In certain embodiments, quantum dots can be capable of emitting infrared light.

The present invention will be further clarified by the following example, which is intended to be exemplary of one aspect of the present invention.

EXAMPLE 1

Fabrication of a Light Emitting Device

Glass (50 mm×50 mm in area) with patterned indium tin oxide (ITO) electrodes on one surface is cleaned ultrasonically using sequential immersions in de-ionized water, acetone and isopropyl alcohol baths, which is followed by cleaning with oxygen plasma for 6 minutes to remove contaminants. An EIL/ETL Material Solution is prepared as described below and spin-coated at 2000 rpm onto the ITO. Subsequent annealing at 300° C. on a hot plate for 5 minutes in air converts Zn(ac) to Zinc oxide. After baking, the ZnO layer is rinsed with de-ionized water and methanol to remove any residual organic material from the surface. The thickness of ZnO layer is approximately 50 nm. The substrate is then transferred into nitrogen-filled glove box, which normally has oxygen and water levels below 1 ppm. A coating formulation including core/shell quantum dots with pre-selected emission characteristics dispersed in hexane is spin coated on the ZnO surface at 2000 rpm for about 30 seconds. The target thickness of the quantum dot layer is about 30 nm. The quantum dot layer is then baked at 80° C. for 30 minutes in a vacuum oven to remove the solvent. The sample is then placed into a box filled with about 60% humidity nitrogen at 87° F. and exposed to light from a blue LED source (with wavelength of 460 nm, and intensity of 20 mW/cm$^2$) for approximately thirty minutes. Once this step is completed, the water-vapor-treated sample is placed back into the nitrogen glove box for further processing. The sample is then transferred to a vacuum deposition chamber and pumped down to $10^{-7}$ Torr for evaporation of subsequent device layers. A 65 nm thick layer of hole transport material (s-2NPB) is first evaporated onto the QD emissive layer, and then a 15 nm thick hole injection layer (LG-101 available from LG Chem, LTD) is deposited. Finally, a 100 nm thick Al anode is deposited to complete the device.

After formation of the Al anode, current at 4V is applied to the device in a glovebox under a nitrogen atmosphere for 1 minute to excite the quantum dots to emit light.

After excitation, the device is placed in the vacuum deposition chamber under a vacuum of about $10^{-7}$ Torr. The device is vacuum treated, for example, for 3 hours to up to overnight. Other times may also be determined to be suitable.
Electron-Injection Layer (EIL) and Electron Transport Layer (ETL) Material Solution Preparation An electron injection/electron transport layer comprising zinc oxide is prepared from a solution of 12.56 g of zinc acetate [Zn(ac)] dehydrate (Aldrich, 99.999% purity), 76.8 ml of 2-methoxyethanol anhydrous 99.8% and 3.2 ml of ethanolamine redistilled 99.5+%. The Zn(ac) solution is then mixed and shaken or magnetically stirred for 3 hours on a stirring plate and then an ultrasonic agitation is applied for 2 hours in a DI water filled bath.

EXAMPLE 2

Another example of treatment of a device in accordance with an embodiment of a method described herein is provided in this Example 2.

EXAMPLE 2A

Preparation of a Light Emitting Device Including a Quantum Dot Emissive Material A device was prepared in general accordance with the following procedure:

Glass (50 mm×50 mm) with patterned indium tin oxide (ITO) electrodes on one surface was cleaned with UV Ozone for about 6 minutes to remove contaminants.

An electron injection/electron transport layer comprising zinc oxide was prepared as follows. A zinc acetate [Zn(ac)] solution was spun coated at 2000 rpm onto the ITO. Subsequent annealing at 300° C. on hot plate for 5 minutes in air converted Zn(ac) to Zinc oxide. Rinsing of the annealed Zn(ac) layer in de-ionized water, ethanol and acetone is expected to remove any residual organic material from the surface, leaving only a crystalline ZnO film with nanoscale domain size. The target thickness of ZnO film was about 50 nm.

The metal oxide coated glass was then transferred into nitrogen-filled glove box, which normally has oxygen and water levels below 1 ppm. A dispersion of CdSe/CdS (red-emitting) core-shell quantum dots (prepared substantially as described in Example 2C below) dispersed in hexane was spun coated on ZnO surface at 2000 rpm for about 30 seconds. The target thickness of quantum dot film was about 30 nm. Then the quantum dot film was baked at 80° C. for 30 minutes in a vacuum oven to remove the solvent.

At this point the samples were placed into a box filled with about 80% humidity nitrogen at 85° F. and exposed to blue (460 nm) light for thirty minutes.

Samples were then transferred to a vacuum deposition chamber and pumped down to $10^{-6}$ torr or better for evaporation of subsequent device layers.

An approximately 65 nm layer of hole transport material (s-2NPB) were then evaporated onto the emissive layer in a deposition chamber after the chamber was pumped down to $10^{-6}$ torr or better.

A hole injection layer (LG-101 available from LG Chem, LTD.) (approximately 15 nm) was formed over the hole transport layer by evaporation techniques.

100 nm Al anode was deposited.

A glass lid was then affixed to the device using UV-curable epoxy.

EXAMPLE 2B

Treatment of a Light Emitting Device

A completed device prepared generally as described above in Example 2A was further processed as described in this Example 2B.

The glass lid affixed to the device by UV-durable epoxy was removed in air using a razor blade following which the device was immediately placed into a chamber under a nitrogen atmosphere.

While in the nitrogen chamber the device was connected electrically so that voltage could be supplied and the current measured. A photodiode (Hamamatsu S1337-1010BR) was placed in front of the device to measure the light output. Voltage was applied to the device; the voltage swept from 0 to 5V while the light output was measured with a photodiode. The curve labeled 'Initial' in FIG. 2 graphically illustrates the initial efficiency as a function of photodiode current.

The device was then operated at 4V for 60 seconds under the nitrogen atmosphere to excite the quantum dots included in the device. A second LIV measurement was taken after the excitation step. The corresponding data is shown in FIG. 2 by the curve labeled 'After Electro'.

After the excitation step, the device was exposed to vacuum of $8.6 \times 10^{-3}$ mbar and the LIV from 0-5V was checked every 5 minutes to track the device performance during vacuum exposure. The third curve in FIG. 2 labeled 'After 10 hours Vac' shows the data from a third LIV measurement taken after 10 hours of vacuum treatment.

In the graphical presentation of the results of this Example 2A, the x-axis represents the brightness of the device under test, expressed as the current through the photodiode, while the y-axis represents the relative efficiency (designated as "Rel. EQE" in FIG. 2) of the device, which is calculated by dividing the photodiode current by the current through the device.

Figure 2:
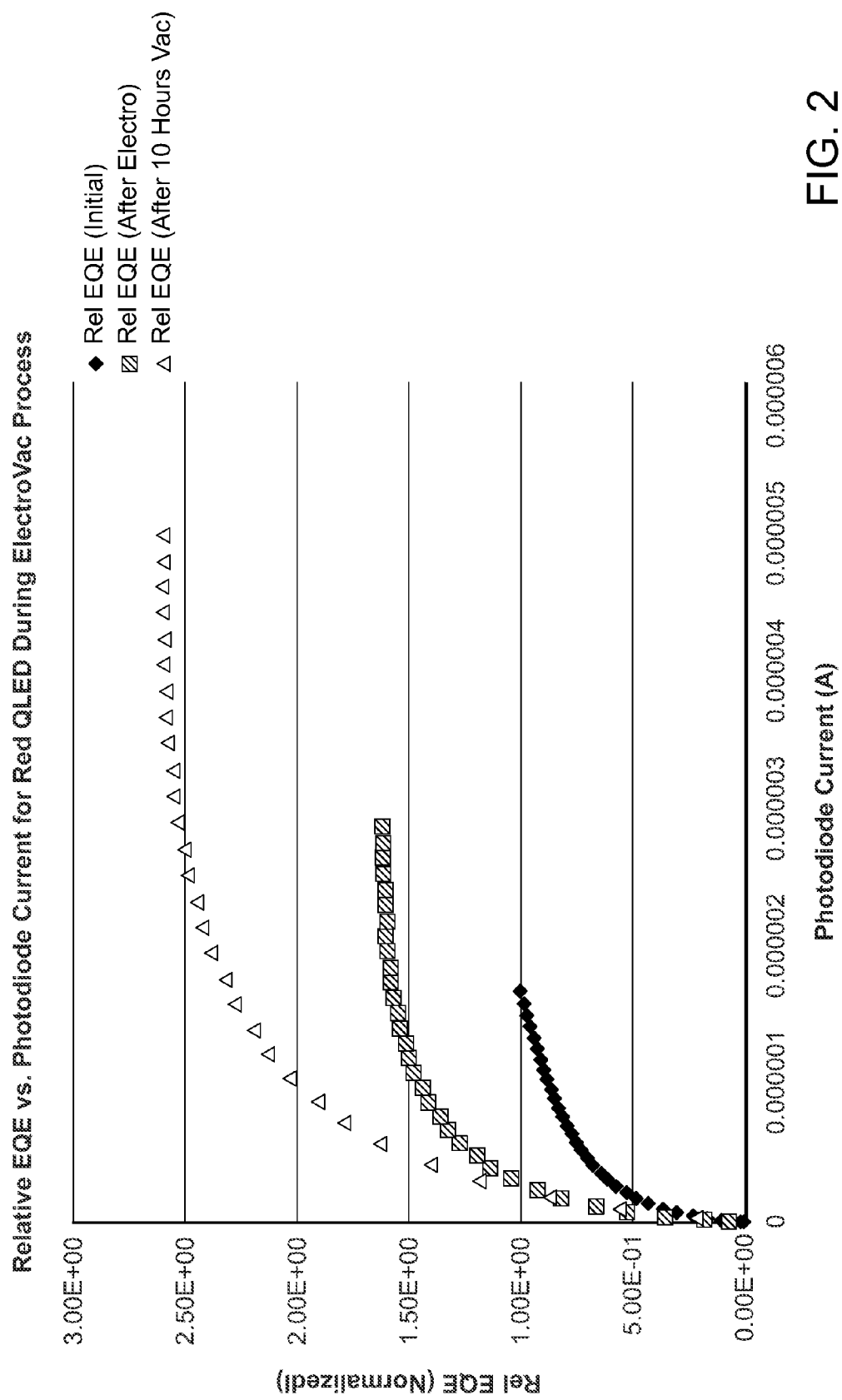
FIG. 2 graphically presents data for a device processed by an example of a method in accordance with the invention.

The data in FIG. 2 illustrates an example of performance improvements that can be obtained by treating a device in accordance with a method described herein.

EXAMPLE 2C

Preparation of Semiconductor Nanocrystals Capable of Emitting Red Light

Synthesis of CdSe Cores:
26.23 mmol cadmium acetate was dissolved in 235.4 mmol of tri-n-octylphosphine at 100° C. in a 250 mL 3-neck round-bottom flask and then dried and degassed for one hour. 465.5 mmol of trioctylphosphine oxide and 59.8 mmol of octadecylphosphonic acid were added to a 0.5 L stainless steel reactor and dried and degassed at 140° C. for one hour. After degassing, the Cd solution was added to the reactor containing the oxide/acid and the mixture was heated to 298° C. under nitrogen. Once the temperature reached 298° C., 425 mmol of aerated tri-n-butylphosphine (see preparation below) was injected into the flask. The temperature of the mixture was then raised to 305° C. where 105 mL of 1.5 M aerated TBP-Se (see preparation below) was then rapidly injected. The reaction was allowed to proceed for 13 minutes (aliquots taken at 1 minute intervals to observe the growth and corresponding absorption wavelength shift) at which point the reactor was then immediately submerged in partially frozen (via liquid nitrogen) squalane bath rapidly reducing the temperature of the reaction to below 100° C. The first absorption peak of the nanocrystals was 561 nm. The CdSe cores were precipitated out of the growth solution inside a nitrogen atmosphere glovebox by adding a 3:1 mixture of methanol and isopropanol. The isolated cores (abs=557 nm) were then dissolved in hexane and used to make core-shell materials.

Preparation of Aerated TBP-Se:

9.5 mol of TBP (Strem Lot A4329040) was loaded into a 3 L 3-neck round-bottom flask. A tank of dry compressed air was used to bubble dry air into the TBP at a rate of 4 L per minute. The temperature of the TBP was monitored during the aeration process.

| Elapsed Time (min) | Temperature (° C.) |
|---|---|
| 0 | 22.8 |
| 14 | 30.7 |
| 58 | 43.1 |
| 80 | 47.1 |
| 108 | 54.9 |
| 188 | 79.5 |

This aerated TBP was then combined with pure TBP (Strem 99%) in a ratio of 1:3 and then used as aerated TBP. The TBP-Se was made by mixing 105 mL of aerated TBP with 13.03 g of Se shot generating 1.5 M TBP-Se used in the core preparation above.

Synthesis of CdSe/CdS Core-Shell Nanocrystals:

517.3 mmol of trioctylphosphine oxide and 48.3 mmol of Octadecylphosphonic acid were loaded into a 0.5 L glass reactor. The mixture was then dried and degassed in the reactor by heating to 120° C. for about an hour. The reactor was then cooled to 70° C. and the hexane solution containing isolated CdSe cores (1.98 mmol Cd content) was added to the reaction mixture. The hexane was removed under reduced pressure followed by the addition of 85.33 mmol of decylamine. Dimethyl cadmium, diethyl zinc, and hexamethyldisilathiane were used as the Cd, Zn, and S precursors, respectively. The total metal (Cd+Zn) and S were mixed in equimolar ratios. The metal (4.64 mmol of dimethylcadmium and diethylzinc respectively) and S (9.27 mmol of hexamethyldisilathiane) precursor samples were each dissolved in 40 mL of trioctylphosphine inside a nitrogen atmosphere glove box. Once the precursor solutions were prepared, the reaction flask was heated to 155° C. under nitrogen. The precursor solutions were added dropwise over the course of 2 hours at 155° C. using a syringe pump. After the shell growth, the nanocrystals were transferred to a nitrogen atmosphere glovebox and precipitated out of the growth solution by adding a 3:1 mixture of methanol and isopropanol. The isolated core-shell nanocrystals were then dissolved in hexane and precipitated a second time by adding a 3:1 mixture of methanol and isopropanol. The isolated core-shell nanocrystals were then dissolved in hexane and used to make QLEDs. The material specifications were as follows: Abs=593 nm; Emission=602 nm; FWHM 28 nm; QY=84% in 90 mL of hexane.

A light-emitting device in accordance with the invention can be used to make a light-emitting device including red-emitting, green-emitting, and/or blue-emitting quantum dots. Other color light-emitting quantum dots can be included, alone or in combination with one or more other different quantum dots. In certain embodiments, separate layers of one or more different quantum dots may be desirable. In certain embodiments, a layer can include a mixture of two or more different quantum dots.

Light-emitting devices in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

In certain embodiments, a device taught herein can comprise a photodetector device including a layer comprising quantum dots selected based upon absorption properties. When included in a photodetector, quantum dots are engineered to produce a predetermined electrical response upon absorption of a particular wavelength, typically in the IR or MIR region of the spectrum. Examples of photodetector devices including quantum dots (e.g., semiconductor nanocrystals) are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety.

Other materials, techniques, methods, applications, and information that may be useful with the present invention are described in: International Application No. PCT/US2007/013152, filed Jun. 4, 2007, of Coe-Sullivan, et al., for "Light-Emitting Devices And Displays With Improved Performance"; International Application No. PCT/US2010/056397 of Kazlas, et al., filed 11 Nov. 2010, entitled "Device Including Quantum Dots", and International Application No. PCT/US2008/013504, filed Dec. 8, 2008, entitled "Flexible Devices Including Semiconductor Nanocrystals, Arrays, and Methods", of Kazlas, et al., which published as WO2009/099425 on Aug. 13, 2009, U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", U.S. application Ser. No. 12/283,609, filed 12 Sep. 2008 of Coe-Sullivan, et al., for "Compositions, Optical Component, System Including An Optical Component, Devices, And Other Products", and 'International Application No. PCT/US2009/002789 of Coe-Sullivan et al, filed 6 May 2009, entitled: "Solid State Lighting Devices Including Quantum Confined Semiconductor Nanoparticles, An Optical Component For A Solid State Light Device, And Methods, each of the foregoing being hereby incorporated herein by reference in its entirety.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for preparing a device, the method comprising: fabricating a device structure including quantum dots disposed between two electrodes; applying energy to the device to excite the quantum dots to emit light; and placing the device structure under vacuum after excitation of the quantum dots.

2. A method in accordance with claim 1 wherein the excitation step is carried out in air.

3. A method in accordance with claim 1 wherein the excitation step is carried out in an inert atmosphere.

4. A method in accordance with claim 1 wherein the quantum dots are excited for at least 30 seconds.

5. A method in accordance with claim 1 wherein the device is placed under vacuum for at least 30 minutes.

6. A method in accordance with claim 1 wherein the device is placed under a vacuum of at least 10 torr.

7. A method in accordance with claim 1 further including repeating a sequence of steps including the step of applying energy and the vacuum step one or more times.

8. A method in accordance with claim 1 further comprising encapsulating the device after the vacuum step.

9. A method in accordance with claim 8 wherein the device is encapsulated in the absence of oxygen.

10. A method in accordance with claim 1 wherein the quantum dots included in the device are not excited to emit light during the vacuum step.

11. A method in accordance with claim 1 wherein the method further comprises further processing of the device after the vacuum step in the absence of oxygen.

12. A method in accordance with claim 1 wherein the device further includes a first charge transport layer.

13. A method in accordance with claim 1 wherein the device further includes a second charge transport layer.

14. A method in accordance with claim 12 wherein the first charge transport layer comprises an inorganic semiconductor material.

15. A method in accordance with claim 13 wherein the second charge transport layer comprises an organic semiconductor material.

16. A method in accordance with claim 1 wherein the device is unencapsulated or less than fully encapsulated during the excitation and evacuation steps.

17. A method in accordance with claim 1 wherein fabricating the device comprises disposing quantum dots over a first electrode and exposing the quantum dots to small molecules prior to completing fabrication of the device structure.

18. A method in accordance with claim 1 wherein fabricating the device comprises disposing quantum dots over a first electrode and exposing the quantum dots to light flux in the presence of small molecules prior to completing fabrication of the device structure.

19. A device including quantum dots disposed between a pair of electrodes wherein the device is made by a method in accordance with claim 1.

20. A method in accordance with claim 1 wherein the device comprises a light-emitting device.

* * * * *